(12) United States Patent
Murase

(10) Patent No.: US 7,868,707 B2
(45) Date of Patent: Jan. 11, 2011

(54) SURFACE-MOUNT TYPE CRYSTAL OSCILLATOR

(75) Inventor: Shigeyoshi Murase, Saitama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 62 days.

(21) Appl. No.: 12/337,977

(22) Filed: Dec. 18, 2008

(65) Prior Publication Data
US 2009/0160561 A1  Jun. 25, 2009

(30) Foreign Application Priority Data
Dec. 19, 2007  (JP) .............................. 2007-326709

(51) Int. Cl.
*H03B 1/00* (2006.01)
(52) U.S. Cl. ...................... 331/68; 331/108 C; 331/158
(58) Field of Classification Search .................. 331/68, 331/108 C, 108 D, 158; 310/340, 348
See application file for complete search history.

(56) References Cited

U.S. PATENT DOCUMENTS
6,882,232 B2 * 4/2005 Harima .......................... 331/68
2007/0075795 A1 * 4/2007 Moriya ........................ 331/158

FOREIGN PATENT DOCUMENTS
JP 10-098151 A 4/1998
JP 2000-077942 A 3/2000
JP 2001-007647 A 1/2001
JP 2003-163540 A 6/2003
JP 2003-204221 A 7/2003
JP 2005-065140 A 3/2005
JP 2007-104075 A 4/2007
JP 2007-142869 A 6/2007

OTHER PUBLICATIONS

Japanese Office Action for Japanese Patent Application No. 2007-326709 dated Apr. 22, 2010 with English translation.

* cited by examiner

*Primary Examiner*—Joseph Chang
*Assistant Examiner*—Jeffrey Shin
(74) *Attorney, Agent, or Firm*—Cantor Colburn LLP

(57) ABSTRACT

The surface-mount type crystal oscillator includes a container body made of laminated ceramics, having a flat bottom wall layer, a frame wall defining a recess and a step portion formed at an inner wall of the recess, a crystal blank fixed to the step portion, an IC chip fixed to an inner bottom surface of the recess and a pair of inspection terminals provided on outer side surfaces of the container body and used to measure a vibration characteristic of the crystal blank. The bottom wall layer is made up of a first layer making up an outer bottom surface of the container body and a second layer between the first layer and the frame wall, and the inspection terminals are formed so as to extend across an end face of the second layer and the outer side surface of the frame wall.

3 Claims, 3 Drawing Sheets

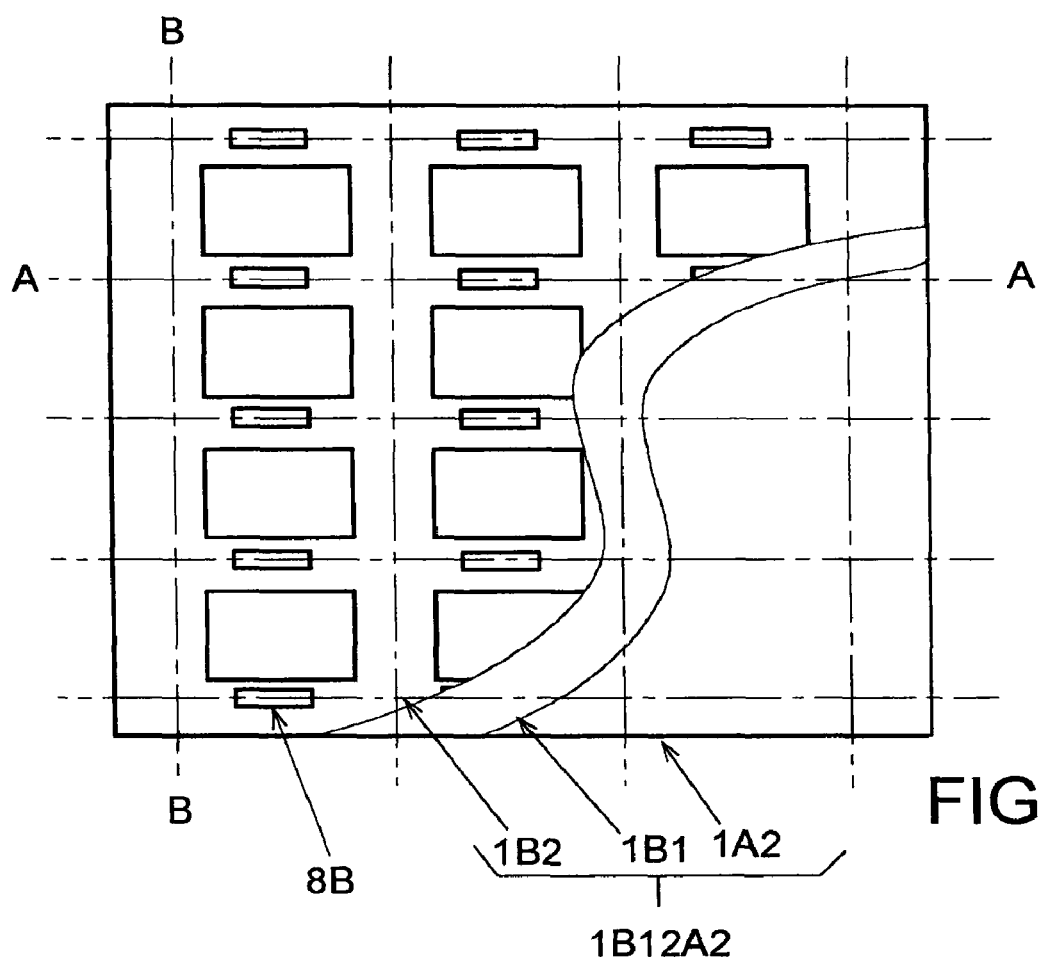

SURFACE-MOUNT TYPE CRYSTAL OSCILLATOR

BACKGROUND OF THE INVENTION

1. Field of the Invention

The present invention relates to a surface-mount type quartz crystal oscillator, and more particularly, to a surface-mount type crystal oscillator having an inspection terminal for inspecting a vibration characteristic of a quartz crystal blank.

2. Description of the Related Art

Crystal oscillators accommodating a quartz crystal blank and an IC (integrated circuit) chip provided with an oscillation circuit using this crystal blank in a container are used as frequency and time reference sources for various devices. Especially, a surface-mount type crystal oscillator using a container for surface mounting is small and light, and is therefore generally incorporated particularly in portable electronic devices. One of such crystal oscillators is a surface-mount type crystal oscillator for clocks having a frequency-temperature characteristic dependent on a temperature characteristic of a crystal blank.

FIG. 1A is a partially cutaway front view showing an example of a conventional surface-mount type crystal oscillator, and FIG. 1B is a plan view of the crystal oscillator shown in FIG. 1A with its metal cover, crystal blank and third frame wall layer removed.

The crystal oscillator shown in FIG. 1 accommodates IC chip 2 and crystal blank 3 in container body 1 in which a recess is formed. Metal cover 4 covers the top surface of container body 1 surrounding the opening of the recess, and IC chip 2 and crystal blank 3 are hermetically encapsulated within the recess. Container body 1 has a substantially rectangular plane shape and the recess is provided on one principal surface thereof. Such container body 1 is made of laminated ceramics including substantially rectangular, flat bottom wall layer 1a and frame wall 1b provided on one principal surface of bottom wall layer 1a and having an aperture. The recess is formed of the aperture of frame wall 1b. Here, bottom wall layer 1a is made of a single-layer ceramic sheet, but frame wall 1b is made of three layers of ceramic sheets; first layer 1b1, second layer 1b2 and third layer 1b3 from the bottom wall layer side. Since the aperture provided in third layer 1b3 is made larger than the apertures provided in first layer 1b1 and second layer 1b2, a step portion is formed in the inner wall of the recess. A pair of holding terminals 5 are provided on this step portion. A plurality of circuit terminals are provided on the inner bottom surface of the recess and two of these circuit terminals are electrically connected to holding terminals 5 via a conductive path (not shown) formed in container body 1.

In four corners of the outer bottom surface of container body 1, that is, the other principal surface of bottom wall layer 1a, there are provided mounting terminals 6 electrically connected to the circuit terminals and used to surface-mount this crystal oscillator on a wiring board. Mounting terminals 6 include a power supply terminal, an output terminal, a grounding terminal and a standby terminal. On the outer side surfaces of container body 1, there are provided inspection terminals 7a, 7b. Inspection terminals 7a, 7b are used to measure a vibration characteristic of crystal blank 3 from outside and are electrically connected to a pair of circuit terminals which are connected to holding terminals 5 Inspection terminals 7a, 7b are formed on a pair of opposite outer side surfaces of container body 1, on the sides of frame wall 1b except the highest layer, that is, third layer 1b3. At the positions at which inspection terminals 7a, 7b are formed, as shown in FIG. 1B, substantially rectangular depressed portions 8 are formed on the outer sides of frame wall 1b and inspection terminals 7a, 7b are formed on the inner surfaces of depressed portions 8.

As shown in FIG. 2, crystal blank 3 is, for example, a substantially rectangular AT-cut quartz crystal blank and excitation electrodes 10a are provided on both principal surfaces thereof. Lead-out electrodes 10b extend from excitation electrodes 10a toward both sides of one end of crystal blank 3, respectively. Both sides of one end of crystal blank 3 toward which lead-out electrodes 10b extend are fixed to holding terminals 5 using conductive adhesive 11 or the like, and crystal blank 3 is thereby electrically and mechanically connected to holding terminals 5 and held in the recess of container body 1.

IC chip 2 has a substantially rectangular shape and is made up of electronic circuits including at least an oscillation circuit using crystal blank 3, the electronic circuits integrated on a semiconductor substrate. In IC chip 2, since the electronic circuits such as an oscillation circuit are formed on one principal surface of the semiconductor substrate through a normal semiconductor device fabrication process, the principal surface on which these electronic circuits are formed among the pair of the principal surfaces of the semiconductor substrate will be referred to as a "circuit forming surface" of the IC chip. A plurality of IC terminals for connecting IC chip 2 to an external circuit are also formed on the circuit forming surface. IC terminals include a power supply terminal, grounding terminal, oscillation output terminal, standby terminal, a pair of connection terminals for connection with crystal blank 3, or the like. IC chip 2 is electrically and mechanically connected to container body 1 and also electrically connected to crystal blank 3 and mounting terminals 6 by fixing the IC terminals to the circuit terminals formed on the inner bottom surface of the recess through ultrasonic thermocompression bonding using, for example, bumps 9.

A metal ring is formed on the top surface of third layer 1b3 so as to surround the recess of container body 1 and metal cover is bonded to the metal ring through seam welding or the like. The recess is hermetically closed in this way.

Container body 1 of the above described crystal oscillator is formed by stacking and burning unburned ceramic raw sheets, that is, ceramic green sheets, corresponding to bottom wall layer 1a and first to third layers 1b1 to 1b3. In this case, by stacking and burning together the ceramic green sheets corresponding in size to a plurality of container bodies 1 and then dividing the burned body into individual container bodies 1, a plurality of container bodies 1 can be obtained simultaneously through single burning. Before stacking and then burning the ceramic green sheets, inspection terminals 7a, 7b and depressed portions 8 are formed. Holding terminals 5, mounting terminals 6, inspection terminals 7a, 7b and circuit terminals are formed as electrode layers provided on the surface of the laminated ceramics.

FIG. 3 shows manufacturing steps of depressed portions 8 and inspection terminals 7a, 7b. In this figure, parting lines when dividing the burned body into the individual burned container bodies 1 are shown as lines A-A and lines B-B. Here, parting lines A-A are parting lines along the long side of container body 1 and parting lines B-B are parting lines along the short side of container body 1.

Slit-like through holes 8B to be transformed into depressed portions 8 are formed in frame wall sheet 1B12, which is made up of ceramic green sheets 1B1, 1B2 corresponding to first layer 1b1 and second layer 1b2 of frame wall 1b stacked together, on parting lines A-A along the long sides of container bodies 1. When a circuit pattern making up circuit terminals and conductive paths connected to the circuit terminals is formed with tungsten (W) or molybdenum (Mo) using a printing method, tungsten or molybdenum material is charged into through holes 8B and base electrodes are formed on inner surfaces of through holes 8B.

Next, frame wall sheet 1B12, a ceramic sheet corresponding to bottom wall layer 1a and a ceramic sheet corresponding to third layer 1b3 are stacked together to form a container body sheet and these are integrally burned. After burning, nickel (Ni) and gold (Au) films are formed one by one on the base electrode through, for example, electrolytic plating. In the figure, the electrode pattern used in conducting electrolytic plating is omitted for convenience' shake. In this way, inspection terminals 7a, 7b are formed together with holding terminals 5, mounting terminals 6, circuit terminals, and conductive paths connecting these terminals. After this, the container body sheet is divided along parting lines A-A and parting lines B-B to obtain individual container bodies 1.

Next, IC chip 2 and crystal blank 3 are accommodated in the recess of container body 1 obtained in this way and metal cover 4 is bonded to the metal ring surrounding the recess, and this completes the crystal oscillator. When metal cover 4 is bonded through seam welding, stress may be applied to container body 1 due to a difference in thermal expansion coefficients between container body 1 and metal cover 4, and this may cause the condition in which conductive adhesive 11 holds crystal blank 3 to change. Therefore, after metal cover 4 is bonded, a measuring probe (not shown) is made to contact inspection terminals 7a, 7b and the vibration characteristic of crystal blank 3 is tested with crystal blank 3 hermetically sealed within the recess. When the vibration characteristics such as crystal impedance (CI) and frequency temperature characteristic do not satisfy standard values, the crystal oscillator is discarded as a non-conforming product.

In the above described crystal oscillator, inspection terminals 7a, 7b are formed in neither the lowest ceramic layer, that is, bottom wall layer 1a, nor the top ceramic layer, that is, third layer 1b3, in the container body made of laminated ceramics. This prevents inspection terminals 7a, 7b from being electrically short-circuited with the circuit pattern on the wiring board or with metal cover 4.

The surface-mount type crystal oscillator with inspection terminals provided on the sides of the container body made of laminated ceramics is disclosed, for example, in Japanese Patent Laid-Open No. 2000-77942 (JP-2000-077942A), Japanese Patent Laid-Open No. 2003-163540 (JP-2003-163540A) and Japanese Patent Laid-Open No. 2007-142869 (JP-2007-142869).

However, the aforementioned surface-mount type crystal oscillators are becoming more compact and, for example, crystal oscillators having a plane outside size of 2.0×1.6 mm and a height of 0.8 mm or less are under study. When such a size reduction advances, the areas of inspection terminals 7a, 7b are made smaller and especially the length in the vertical direction, that is, the height of the inspection terminal becomes smaller, which may cause insufficient contact between the measuring probe and the inspection terminals in inspecting the vibration characteristic of crystal blank 3.

SUMMARY OF THE INVENTION

It is an object of the present invention to provide a surface-mount type crystal oscillator that allows the area, and height in particular, of an inspection terminal to be increased and thereby ensures contact of a measuring probe.

The object of the present invention can be attained by a surface-mount type crystal oscillator including: a container body made of laminated ceramics, having a flat bottom wall layer and a frame wall having an aperture formed on the bottom wall layer, the frame wall defining a recess and a step portion being formed at an inner wall of the recess; a crystal blank fixed to the step portion, an IC chip fixed to an inner bottom surface of the recess and provided with an oscillation circuit using the crystal blank; and a pair of inspection terminals provided on outer side surfaces of the container body, electrically connected to the crystal blank and used to measure a vibration characteristic of the crystal blank, wherein each of the inspection terminals is formed on an inner surface of a depressed portion formed on the outer side surface of the container body at a forming position of the inspection terminal, the bottom wall layer is made up of a first layer making up an outer bottom surface of the container body and a second layer between the first layer and the frame wall, and each of the inspection terminals is formed so as to extend across an end face of the second layer and an outer side surface of the frame wall.

BRIEF DESCRIPTION OF THE DRAWINGS

FIG. 5 is a view illustrating manufacturing steps of the crystal oscillator shown in FIG. 4.

DETAILED DESCRIPTION OF THE PREFERRED EMBODIMENTS

Figure 1A:
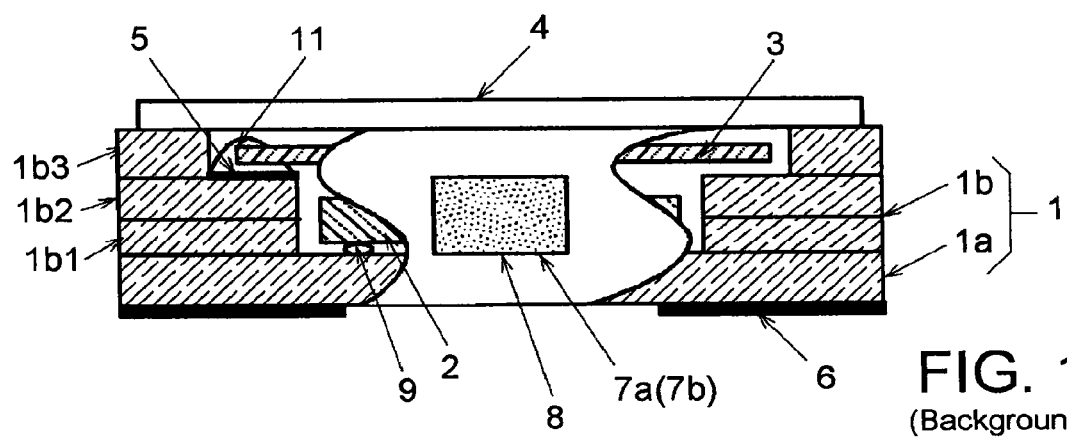
FIG. 1A is a partially cutaway front view showing an example of a conventional surface-mount type crystal oscillator.
Figure 1B:
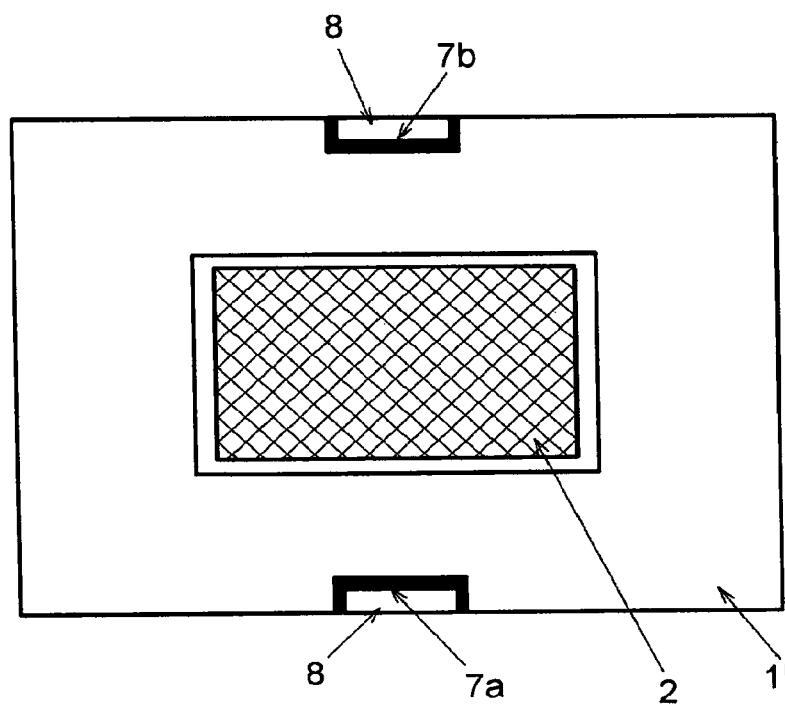
FIG. 1B is a plan view of the crystal oscillator shown in FIG. 1A with a metal cover, crystal blank and third frame wall layer removed.
Figure 2:
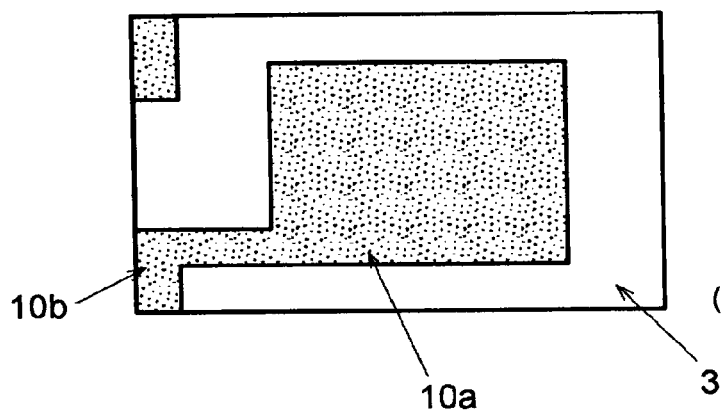
FIG. 2 is a plan view of the crystal blank.
Figure 3:
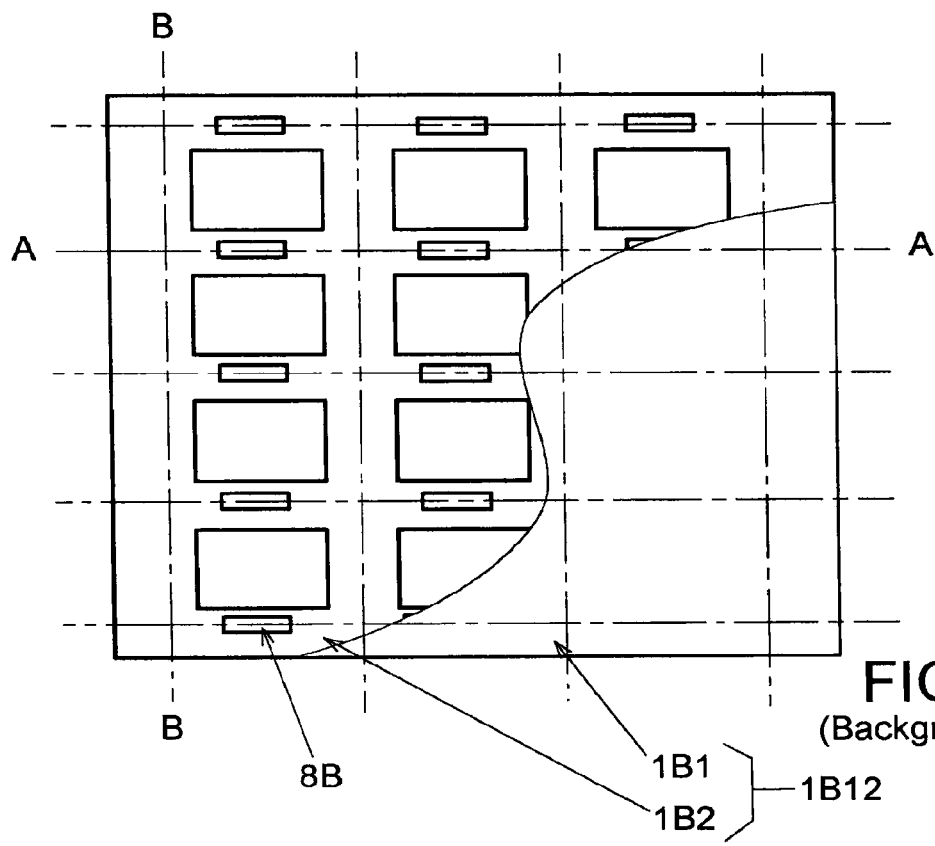
FIG. 3 is a view illustrating manufacturing steps of the crystal oscillator shown in FIGS. 1A and 1B.
Figure 4:
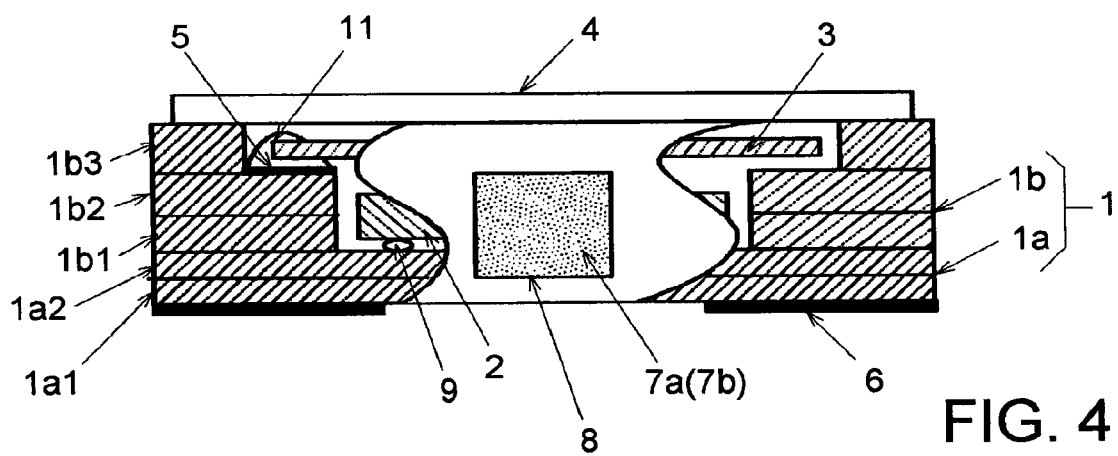
FIG. 4 is a cross-sectional view showing a configuration of a surface-mount type crystal oscillator according to an embodiment of the present invention.

In FIG. 4 showing a surface-mount type crystal oscillator according to an embodiment of the present invention, the same components as those shown in FIGS. 1A and 1B are assigned the same reference numerals and redundant explanations thereof will be omitted or simplified.

As in the case of the one shown in FIGS. 1A and 1B, the crystal oscillator according to this embodiment includes IC chip 2 and crystal blank 3 accommodated within a recess of container body 1 made of laminated ceramics having bottom wall 1a and frame wall 1b. Metal cover 4 is bonded to the surface of container body 1 surrounding the recess, and IC chip 2 and crystal blank 3 hermetically encapsulated within container body 1. A step portion is formed at an inner wall of the recess. IC chip 2 is fixed to the inner bottom surface of the recess so that the circuit forming surface on which IC terminals are provided faces the inner bottom surface of the recess. The perimeter of crystal blank 3 toward which lead-out electrodes 10b extend is fixed to holding terminals 5 on the step portion of the inner wall of the recess.

In the example shown here, suppose the plane outer size of container body I is, for example, 2.0×1.6 mm and the height, that is, the thickness of the laminated ceramics is 0.8 mm. As described above, frame wall 1b is made up of first layer 1b1, second layer 1b2 and third layer 1b3 and has a total thickness of 0.3 mm. Bottom wall layer 1 a has a two-layer configuration unlike the aforementioned one. Specifically, bottom wall layer 1a is made up of first layer 1a1 having a thickness of 0.09 mm constituting an outer bottom surface of container body 1 and second layer 1a2 having a thickness of 0.09 mm between first layer 1a1 and frame wall 1b. Therefore, the thickness of bottom wall layer 1a is 0.18 mm. Both first layer 1a1 and second layer 1a2 of bottom wall layer 1a are rectangular flat ceramic layers of 2.0×1.6 mm in size. First layer 1a1 and second layer 1a2 are directly stacked together with no shield electrode layer or the like interposed in between.

As in the case of the above described one, on a pair of outer side surfaces along the long side of container body 1, there are provided inspection terminals 7a, 7b used to measure the vibration characteristic of crystal blank 3 from outside. In this embodiment, inspection terminals 7a, 7b are formed on end faces of first layer 1b1 and second layer 1b2 of frame wall 1b and also on an end face of second layer 1a2 of bottom wall layer 1a. That is, at the positions at which inspection terminals 7a, 7b are formed, there is provided depressed portion 8 extending over the end faces of the three layers; first layer 1b1 and second layer 1b2 of frame wall 1b, and second layer 1a2 of bottom wall layer 1a. Each of inspection terminals 7a, 7b is formed on an inner surface of the depressed portion. No depressed portion is formed in third layer 1b3 of frame wall 1b and first layer 1a1 of bottom wall 1a, therefore no inspection terminal is formed either, which thereby prevents inspection terminals 7a, 7b from being electrically short-circuited to the circuit pattern on the wiring board or metal cover 4.

In this embodiment, container body 1 is formed by stacking and burning ceramic green sheets corresponding to first and second layers 1a1, 1a2 of bottom wall layer 1a and first to third layers 1b1 to 1b3 of frame wall 1b, each ceramic green sheet having a size corresponding to a plurality of container bodies 1, and then dividing the burned body into individual container bodies 1.

FIG. 5 shows manufacturing steps of depressed portions 8 and inspection terminals 7a, 7b in this embodiment. Slit-like through holes 8B to be transformed into depressed portions 8 are formed in multilayer sheet 1B12A2, which is made up of ceramic sheets 1A2, 1B1 and 1B2 corresponding to second layer 1a2 of bottom wall layer 1a and first layer 1b1 and second layer 1b2 of frame wall 1b stacked together, on parting lines A-A along the long side of container body 1. When forming a circuit pattern making up circuit terminals and conductive paths connected to the circuit terminals with tungsten or molybdenum using a printing method, tungsten or molybdenum material is charged into through holes 8B and base electrodes are formed on inner surfaces of through holes 8B.

Next, the ceramic sheet corresponding to first layer 1a1 of bottom wall layer 1a, multilayer sheet 1B12A2 and ceramic sheet corresponding to third layer 1b3 of frame wall 1b are stacked together to form a container body sheet and these are burned integrally. After burning, nickel and gold films are formed one by one on the base electrode through, for example, electrolytic plating. After this, the container body sheet is divided along parting lines A-A and parting lines B-B to obtain individual container bodies 1.

According to this configuration, since bottom wall layer 1a is formed of first layer 1a1 and second layer 1a2, and portions of inspection terminals 7a, 7b are also formed on the end face of this second layer 1a2, the areas of inspection terminals 7a, 7b can be increased considerably compared to the conventional configuration in which inspection terminals 7a, 7b are formed only on the outer side of frame wall 1b. The height of the inspection terminal in particular can be increased. In this way, even when the size of the surface-mount type crystal oscillator is further reduced, it is possible to make the measuring probe contact the inspection terminal reliably.

This embodiment adopts a two-layer configuration for the bottom wall layer so that these layers are directly stacked together. Since no shield electrode or the like is interposed at the stacking surface between these layers, no reduction of bonding strength due to interposition of a shield electrode or the like takes place, and as a result, mechanical strength of the bottom wall layer improves.

What is claimed is:

1. A surface-mount type crystal oscillator comprising:
    a container body made of laminated ceramics, comprising a flat bottom wall layer and a frame wall having an aperture formed on the bottom wall layer, the frame wall defining a recess and a step portion being formed at an inner wall of the recess;
    a crystal blank fixed to the step portion;
    an IC chip fixed to an inner bottom surface of the recess and provided with an oscillation circuit using the crystal blank; and
    a pair of inspection terminals provided on outer side surfaces of the container body, electrically connected to the crystal blank and used to measure a vibration characteristic of the crystal blank,
    wherein each of the inspection terminals is formed on an inner surface of a depressed portion formed on the outer side surface of the container body at a forming position of the inspection terminal,
    the bottom wall layer is made up of a first ceramic layer making up an outer bottom surface of the container body and a second ceramic layer between the first layer and the frame wall,
    the frame wall is made up of a third ceramic layer, a fourth ceramic layer, and a fifth ceramic layer which are stacked together, the third ceramic layer laminated on the second ceramic layer, the fourth ceramic layer sandwiched by the third and fifth ceramic layer, and the fifth ceramic layer being a topmost surface of the container body in which the recess opens,
    the step portion is formed due to difference of inner sizes between the fourth ceramic layer and the fifth ceramic layer; and
    each of the inspection terminals is formed so as to extend across end faces of the second, third, and fourth ceramic layers so that end faces of the first and fifth ceramic layers are free from the inspection terminal.

2. The crystal oscillator according to claim 1, further comprising a metal cover bonded to a surface of fifth ceramic layer to close the recess.

3. The crystal oscillator according to claim 1, wherein the container body has a substantially rectangular plane shape, and
    the inspection terminal is formed on an outer side surface of the container body along each of a pair of long sides of the container body.

* * * * *